US012646558B2

(12) United States Patent
Lee et al.

(10) Patent No.: US 12,646,558 B2
(45) Date of Patent: Jun. 2, 2026

(54) MEMORY DEVICE INCLUDING SENSE AMPLIFIER AND METHOD OF STORING DATA THEREOF

(71) Applicant: Samsung Electronics Co., Ltd., Suwon-si (KR)

(72) Inventors: Changyoung Lee, Suwon-si (KR); Young Seok Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 130 days.

(21) Appl. No.: 18/421,152

(22) Filed: Jan. 24, 2024

(65) Prior Publication Data
US 2025/0061938 A1 Feb. 20, 2025

(30) Foreign Application Priority Data
Aug. 17, 2023 (KR) ........................ 10-2023-0107937

(51) Int. Cl.
*G11C 11/4091* (2006.01)
*G11C 11/4096* (2006.01)
*G11C 29/52* (2006.01)

(52) U.S. Cl.
CPC ...... *G11C 11/4091* (2013.01); *G11C 11/4096* (2013.01); *G11C 29/52* (2013.01)

(58) Field of Classification Search
CPC .............................................. G11C 11/4091
See application file for complete search history.

(56) References Cited

U.S. PATENT DOCUMENTS

| | | | |
|---|---|---|---|
| 4,982,363 A * | 1/1991 | Sood ...................... | G11C 7/067 |
| | | | 365/207 |
| 7,145,819 B2 | 12/2006 | Penchuk | |
| 7,525,864 B2 | 4/2009 | Brown | |
| 7,567,467 B2 | 7/2009 | Macri et al. | |
| 9,116,828 B2 | 8/2015 | Hollis | |
| 9,548,101 B2 | 1/2017 | Fisch et al. | |
| 10,297,294 B2 | 5/2019 | Hollis et al. | |
| 10,916,324 B2 | 2/2021 | Amato et al. | |
| 11,567,695 B2 | 1/2023 | Best | |
| 2002/0194425 A1* | 12/2002 | Penchuk .................. | G11C 7/12 |
| | | | 711/105 |
| 2005/0018519 A1* | 1/2005 | Nii ........................ | G11C 11/417 |
| | | | 365/227 |

(Continued)

*Primary Examiner* — Douglas King
(74) *Attorney, Agent, or Firm* — Harness, Dickey & Pierce, P.L.C.

(57) ABSTRACT

A memory device includes a memory cell array including memory cells, a single-ended bitline sense amplifier connected to the memory cells through a bitline and a complementary bitline, and electrically connected through one of the bitline or the complementary bitline in response to the memory cells being activated. A DSI circuit is configured to conditionally transmit complementary input data generated by inverting input data to the single-ended bitline sense amplifier in response to a first number of bits included in the input data having a first level greater than a second number of bits included in the input data having a second level, and a data inversion flag indicating that the input data is inverted, to the sense amplifier. The sense amplifier stores the complementary input data in the memory cell array and the data inversion flag in a specified partial area of the memory cell array.

14 Claims, 12 Drawing Sheets

(56)     References Cited

U.S. PATENT DOCUMENTS

2010/0034040 A1*   2/2010   Shimogawa ........ G11C 11/4096
                                                  365/205
2022/0189515 A1*   6/2022   Lee ........................ H10B 12/09

* cited by examiner

MEMORY DEVICE INCLUDING SENSE AMPLIFIER AND METHOD OF STORING DATA THEREOF

CROSS-REFERENCE TO RELATED APPLICATIONS

This application claims priority under 35 U.S.C. § 119 to Korean Patent Application No. 10-2023-0107937 filed on Aug. 17, 2023, in the Korean Intellectual Property Office, the disclosures of which are incorporated by reference herein in their entireties.

BACKGROUND

1. Field

Example embodiments of the present disclosure described herein relate to a semiconductor memory device, and more particularly, relate to a memory device including a sense amplifier and a method of storing data thereof.

2. Description of Related Art

Semiconductor memory devices may be classified as volatile memory devices or non-volatile memory devices. The volatile memory devices may exhibit faster read and/or write speeds when compared to the non-volatile memories. However, data stored in the volatile memory devices may disappear when a power applied to the volatile memory devices is turned off. In contrast, the non-volatile memory devices may retain data stored in the non-volatile memory devices even when a power is turned off. Therefore, the non-volatile memory devices are used to store contents which must be preserved regardless of whether the power is supplied or not.

The volatile memory devices may periodically perform a refresh operation to maintain stored data. The volatile memory devices consume a lot of current to switch states of memory cells into an active state during a read operation or a refresh operation. In particular, during the read operation or the refresh operation, a large amount of current is consumed in a bitline sense amplifier.

SUMMARY

Example embodiments of the present disclosure provide a memory device including a single-ended bitline sense amplifier, and methods of storing data in a memory cell array such that a logic level is biased to reduce current consumed in the bitline sense amplifier during a read operation or a refresh operation.

According to an embodiment, a memory device includes a memory cell array including a plurality of memory cells; a single-ended bitline sense amplifier connected to the plurality of memory cells through a bitline and a complementary bitline, and electrically connected through one of the bitline and the complementary bitline when the plurality of memory cells are activated; and a DSI circuit transmitting complementary input data generated by inverting input data to the single-ended bitline sense amplifier when the number of bits with the first level is greater than the number of bits with the second level in the input data and transmit a data inversion flag indicating which the input data is inverted to the single-ended bitline sense amplifier. The single-ended bitline sense amplifier stores the complementary input data in the memory cell array and store the data inversion flag in a specified partial area of the memory cell array.

According to an embodiment, a memory device includes a peripheral circuit area; and a memory cell area stacked on the peripheral circuit area. The memory cell area includes a memory cell array including normal memory cells and error correction code cells. The peripheral circuit area includes: a single-ended bitline sense amplifier connected to the memory cell array through a bitline and a complementary bitline, and electrically connected through one of the bitline and the complementary bitline when the memory cell array is activated; a DSI circuit transmitting complementary input data generated by inverting input data to the single-ended bitline sense amplifier when the number of bits with the first level is greater than the number of bits with the second level in the input data and transmit a data inversion flag indicating which the input data is inverted to the single-ended bitline sense amplifier; and a DSI register storing the data inversion flag. The single-ended bitline sense amplifier stores the complementary input data in the memory cell array and stores the data inversion flag in the DSI register.

According to an embodiment, a method of storing data in a memory device including a single-ended bitline sense amplifier includes: receiving input data; determining logic levels of bits included in the input data; generating a data inversion flag corresponding to the input data when the number of bits having a first level among the bits included in the input data is greater than the number of bits having a second level; inverting the input data into complementary input data; storing the complementary input data in a memory cell array; and storing the data inversion flag in a specified area.

BRIEF DESCRIPTION OF THE FIGURES

The above and other objects and features of the present disclosure will become apparent by describing in detail embodiments thereof with reference to the accompanying drawings.

FIG. 2 is a block diagram illustrating a memory device of FIG. 1.

FIG. 9 is a diagram illustrating another example of a data storage method of a memory device of FIG. 2.

FIG. 11 is a diagram illustrating another example of a data storage method of a memory device of FIG. 2.

DETAILED DESCRIPTION

Below, example embodiments of the present disclosure will be described in sufficient detail and clarity to allow one of ordinary skill in the art to implement the example embodiments.

Below, a DRAM will be used as an example for illustrating features and functions of the present disclosure. However, other features and performances may be easily understood from information disclosed herein by a person of ordinary skill in the art. The present disclosure may be implemented by other embodiments or applied thereto. Further, the detailed description may be modified or changed according to viewpoints and applications without escaping from the scope, spirit, and other objects of the present disclosure.

Figure 1:
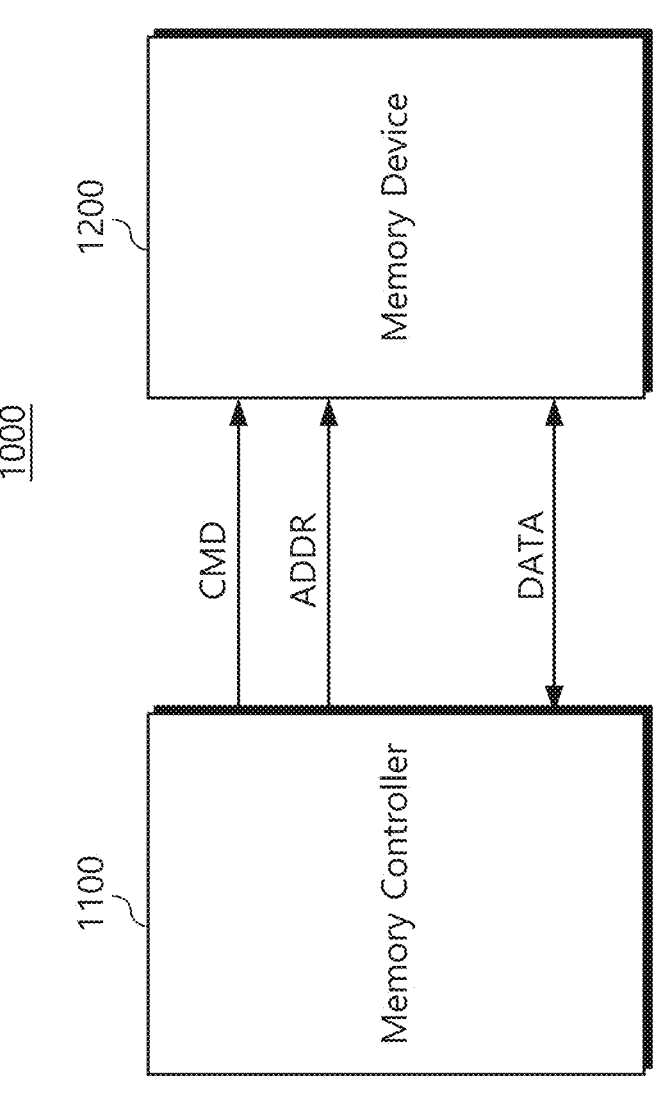
FIG. 1 is a block diagram illustrating a memory system according to an example embodiment.

FIG. 1 is a block diagram illustrating a memory system according to an example embodiment. Referring to FIG. 1, a memory system 1000 may include a memory controller 1100 and a memory device 1200.

According to an example embodiment, the memory controller 1100 may perform an access operation of writing data to the memory device 1200 or reading data stored in the memory device 1200. For example, the memory controller 1100 may generate a command CMD and an address ADDR for writing data to the memory device 1200 or reading data stored in the memory device 1200. The memory controller 1100 may include at least one of a memory controller controlling the memory device 1200, a system-on-chip (SoC) such as an application processor (AP), a central processing unit (CPU), a digital signal processor (DSP), and a graphics processing unit (GPU).

According to an example embodiment, the memory controller 1100 may provide various signals to the memory device 1200 to control an overall operation of the memory device 1200. For example, the memory controller 1100 may control memory access operations of the memory device 1200 such as a read operation and a write operation. The memory controller 1100 may provide the command CMD and the address ADDR to the memory device 1200 to write data DATA in the memory device 1200 or to read data DATA from the memory device 1200.

According to an example embodiment, the memory controller 1100 may generate various types of commands CMD to control the memory device 1200. For example, the memory controller 1100 may generate a bank request corresponding to a bank operation of changing a state of a memory bank, among memory banks, to read or write data DATA. As an example, the bank request may include an activate request for changing a state of a memory bank, among the memory banks, to an active state. The memory device 1200 may activate a row included in the memory bank, for example, a wordline, in response to the activate request. The bank request may include a precharge request for changing the memory banks from an active state to a standby state after reading or writing of data DATA is completed.

In addition, the memory controller 1100 may generate an input/output (I/O) request (for example, a column address strobe (CAS) request) for the memory device 1200 to perform a read operation or a write operation of data DATA. As an example, the I/O request may include a read request for reading data DATA from activated memory banks. The I/O request may include a write request for writing data DATA in the activated memory banks. The memory controller 1100 may generate a refresh command to control a refresh operation on the memory banks. However, the types of commands CMD described herein are merely exemplary, and other types of commands CMD may be present.

According to an example embodiment, the memory device 1200 may output data DATA, requested to be read by the memory controller 1100, to the memory controller 1100 or may store data DATA, requested to be written by the memory controller 1100, in a memory cell of the memory device 1200. The memory device 1200 may input and output data DATA based on the command CMD and the address ADDR. The memory device 1200 may include memory banks.

The memory device 1200 may be a volatile memory device such as a dynamic random access memory (DRAM), a synchronous dynamic random access memory (SDRAM), a double data rate (DDR) DRAM, a DDR SDRAM, a low-power double data rate (LPDDR) SDRAM, a graphics double data rate (GDDR) SDRAM, a Rambus dynamic random access memory (RDRAM), and a static random access memory (SRAM), or the like. Alternatively, the memory device 1200 may be implemented as a nonvolatile memory device such as a resistive RAM (RRAM), a phase change memory (PRAM), a magnetoresistive memory (MRAM), a ferroelectric memory (FRAM), a spin-transfer torque RAM (STT-RAM), or the like. In the present specification, the advantages of the present disclosure have been described with respect to a DRAM, but example embodiments are not limited thereto.

According to an example embodiment, the memory banks may include a memory cell array divided in units of banks, a row decoder, a column decoder, a sense amplifier, a write driver, or the like. The memory banks may store data DATA, requested to be written in the memory device 1200, through the write driver and may read data DATA, requested to be read, using the sense amplifier. The memory banks may further include a component for a refresh operation of storing and maintaining data in the cell array, or select circuits based on an address.

Figure 2:
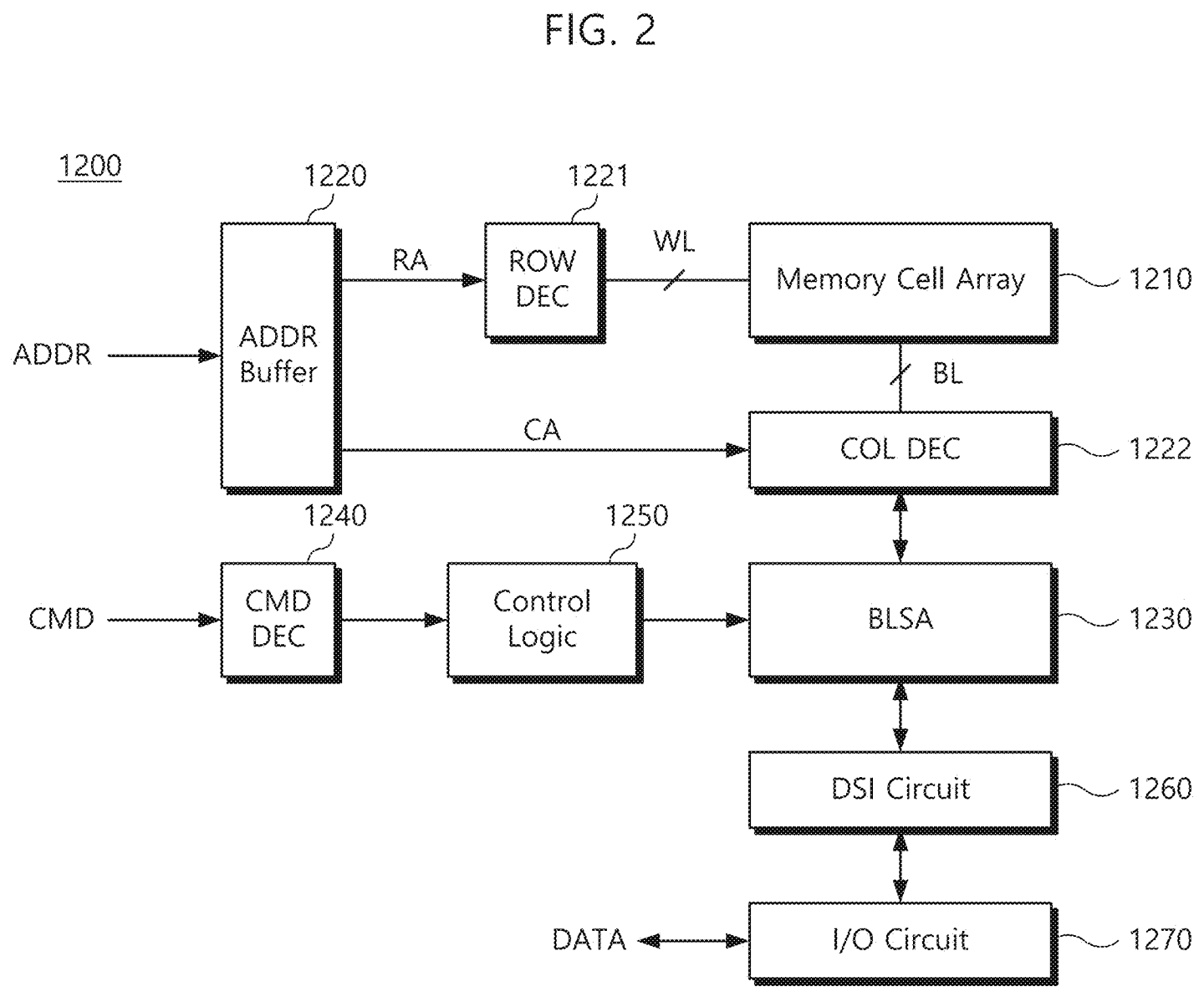

FIG. 2 is a block diagram illustrating a memory device of FIG. 1. Referring to FIG. 2, the memory device 1200 may include a memory cell array 1210, an address buffer 1220, a row decoder 1221, a column decoder 1222, a bitline sense amplifier 1230, a command decoder 1240, control logic 1250, a data stored in cell inversion (DSI) circuit 1260 and an input/output circuit 1270.

According to an example embodiment, the memory cell array 1210 may include a plurality of memory cells arranged in a matrix of rows and columns. For example, the memory cell array 1210 may include a plurality of wordlines WL and a plurality of bitlines BL connected to memory cells. The plurality of wordlines WL may be connected to rows of the memory cells, and the plurality of bitlines BL may be connected to columns of the memory cells.

According to an example embodiment, the address buffer 1220 may receive an address ADDR from the memory controller 1100 of FIG. 1. For example, the address ADDR may include a row address RA addressing a row of the memory cell array 1210 and a column address CA addressing a column of the memory cell array 1210. The address buffer 1220 may transmit the row address RA to the row decoder 1221 and may transmit the column address CA to the column decoder 1222.

According to an example embodiment, the row decoder 1221 may select one of the plurality of wordlines WL connected to the memory cell array 1210. The row decoder 1221 may decode the row address RA, received from the address buffer 1220, to select a single wordline corresponding to the row address RA and may activate the selected wordline.

According to an example embodiment, the column decoder 1222 may select a predetermined bitline from among the plurality of bitlines BL of the memory cell array 1210. The column decoder 1222 may decode the column address CA, received from the address buffer 1220, to select the predetermined bitline BL corresponding to the column address CA.

According to an example embodiment, the bitline sense amplifier 1230 may be connected to the bitlines BL of the memory cell array 1210. For example, the bitline sense amplifier 1230 may sense a change in voltage of a selected bitline, among the plurality of bitlines BL, and may amplify and output the change in voltage. The bitline sense amplifier 1230 may operate as a single-ended sense amplifier. In some example embodiments of a single-ended sense amplifier, there is a difference in current consumption depending on a unit bit included in data DATA during an active operation or a refresh operation. As an example, the bitline sense amplifier 1230 may consume more current in a memory cell in which a high level (or logic 1) (e.g., a first level) is stored than in a memory cell in which a low level (or logic 0) (e.g., a second level) is stored.

As another example, the bitline sense amplifier 1230 may consume less current in a memory cell in which a high level (or logic 1) is stored than in a memory cell in which a low level (or logic 0) is stored. Hereinafter, the bitline sense amplifier 1230 will be described assuming that current consumption is lower in a memory cell storing a low level (or logic 0). However, the data storage method of the present disclosure may be applied even when the bitline sense amplifier 1230 consumes less current in a memory cell in which a high level (or logic 1) is stored.

According to an example embodiment, the command decoder 1240 may decode a write enable signal/WE, a row address strobe signal/RAS, a column address strobe signal/CAS, and a chip select signal/CS received from the memory controller 1100 such that control signals corresponding to the command CMD are generated in the control logic 1250. The command CMD may include an activate request, a read request, a write request, or a precharge request. The control logic 1250 may control an overall operation of the bitline sense amplifier 1230 through the control signals corresponding to the command CMD. The control logic 1250 may generate control signals such that the bitline sense amplifier 1230 operates as a single-ended sense amplifier. Additionally, the control logic 1250 may control an overall operation of the memory device 1200.

According to an example embodiment, the DSI circuit 1260 may invert data DATA transmitted from the input/output circuit 1270 and transmit inverted data to the bitline sense amplifier 1230. For example, the DSI circuit 1260 may check the number of low level bits (or logic 0) or the number of high level bits (or logic 1) included in data DATA. As an example, when the number of low level bits is less than or equal to a specified reference value (e.g., half the total number of bits), the DSI circuit 1260 may invert the data DATA. As another example, when the number of high level bits is greater than or equal to a specified reference value (e.g., half the total number of bits), the DSI circuit 1260 may invert the data DATA.

According to an example embodiment, when the data DATA is inverted, the DSI circuit 1260 may generate a data inversion flag indicating that the inverted data is stored in the memory cell array 1210. The DSI circuit 1260 may transmit the inverted data and the data inversion flag to the bitline sense amplifier 1230. When the data DATA is inverted, the bitline sense amplifier 1230 may store the data inversion flag in a specified area of the memory cell array 1210. Accordingly, during a read operation of inverted data, the bitline sense amplifier 1230 may read the data inversion flag together, and the DSI circuit 1260 may restore the inverted data back to the data DATA and output the data DATA through the input/output circuit 1270.

According to an example embodiment, the input/output circuit 1270 may output data DATA to the memory controller 1100 through data pad based on a sensed and amplified voltage from the bitline sense amplifier 1230. For example, the input/output circuit 1270 may include an input buffer or an output buffer. The input buffer or the output buffer may be connected to the data pad. The input/output circuit 1270 may perform a serialization operation or a deserialization operation of data DATA.

Figure 3:
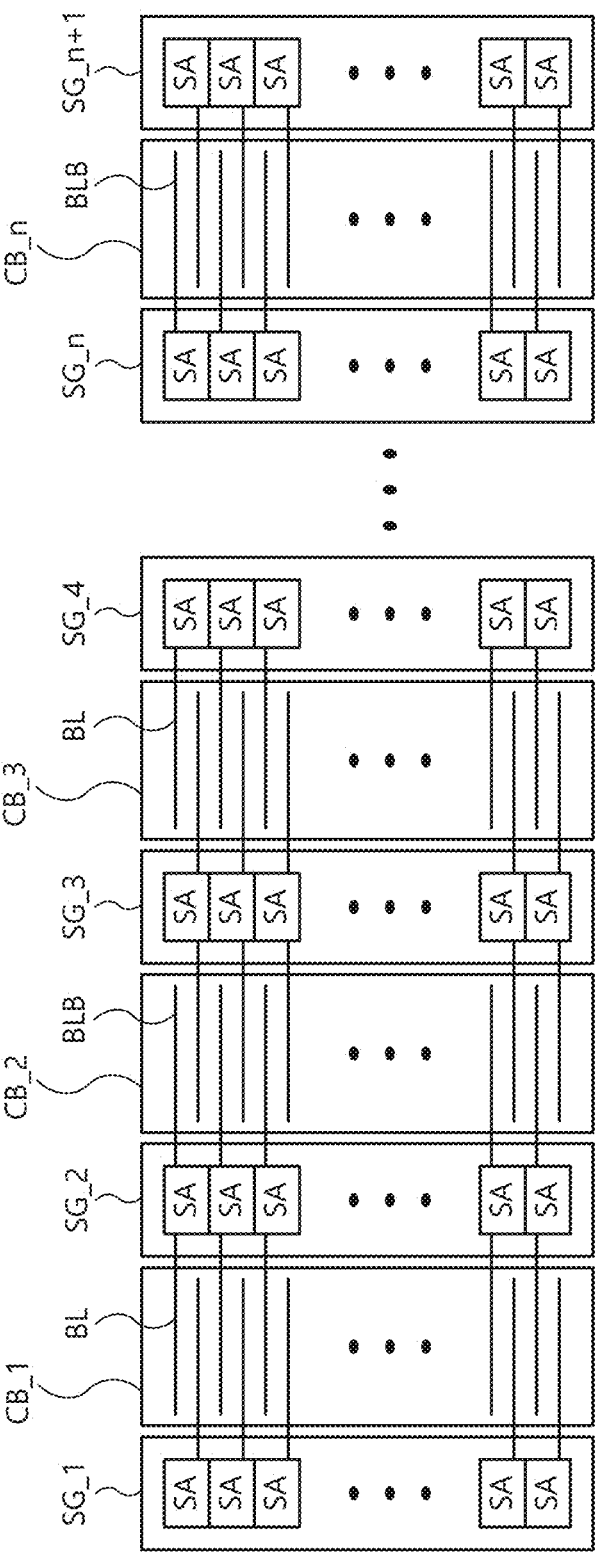
FIG. 3 is a diagram illustrating a connection between a memory cell array and a bitline sense amplifier of FIG. 2.
Figure 4:
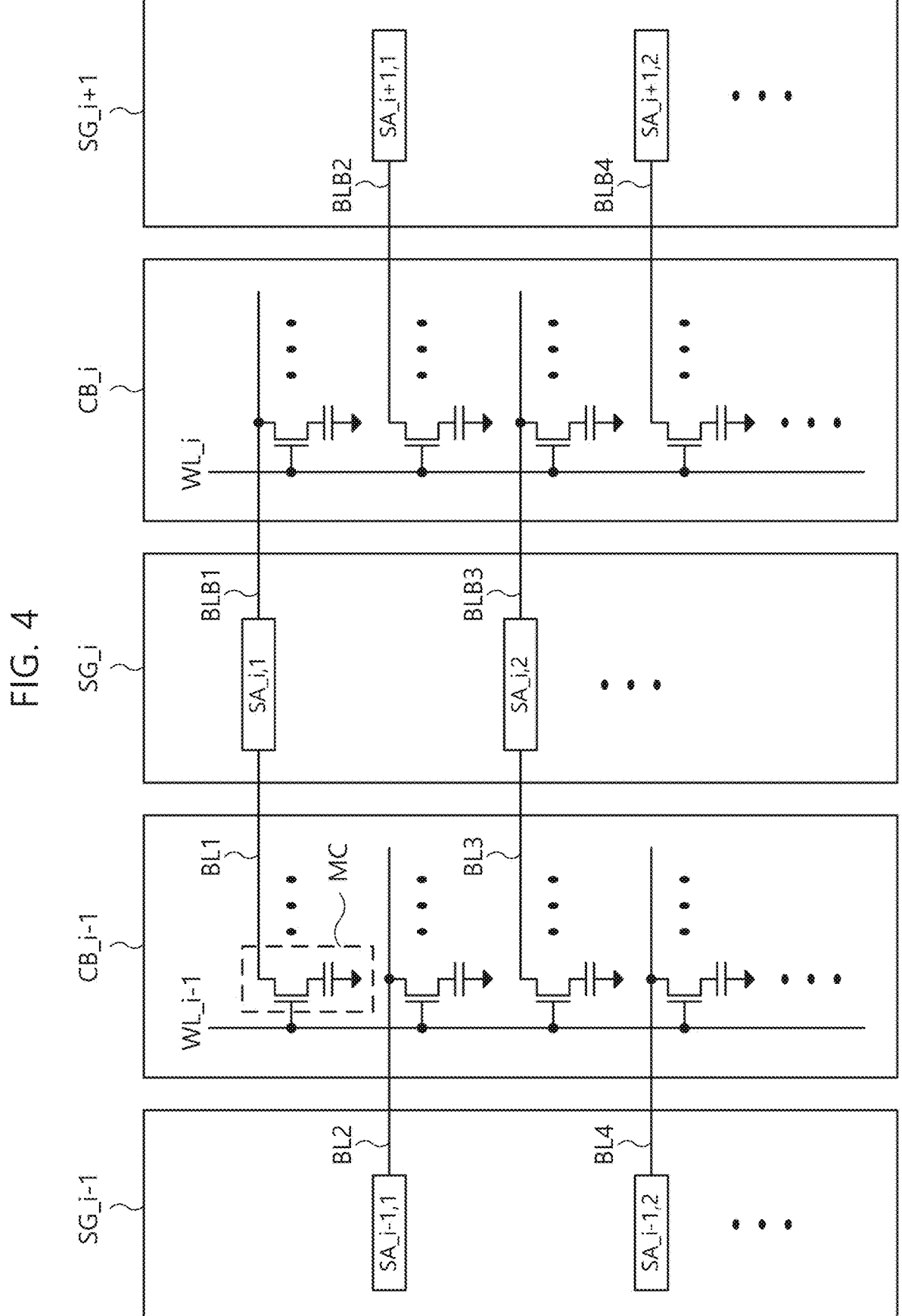
FIG. 4 is a diagram illustrating a connection between a memory cell block and a sense amplifier group in FIG. 3.
Figure 5:
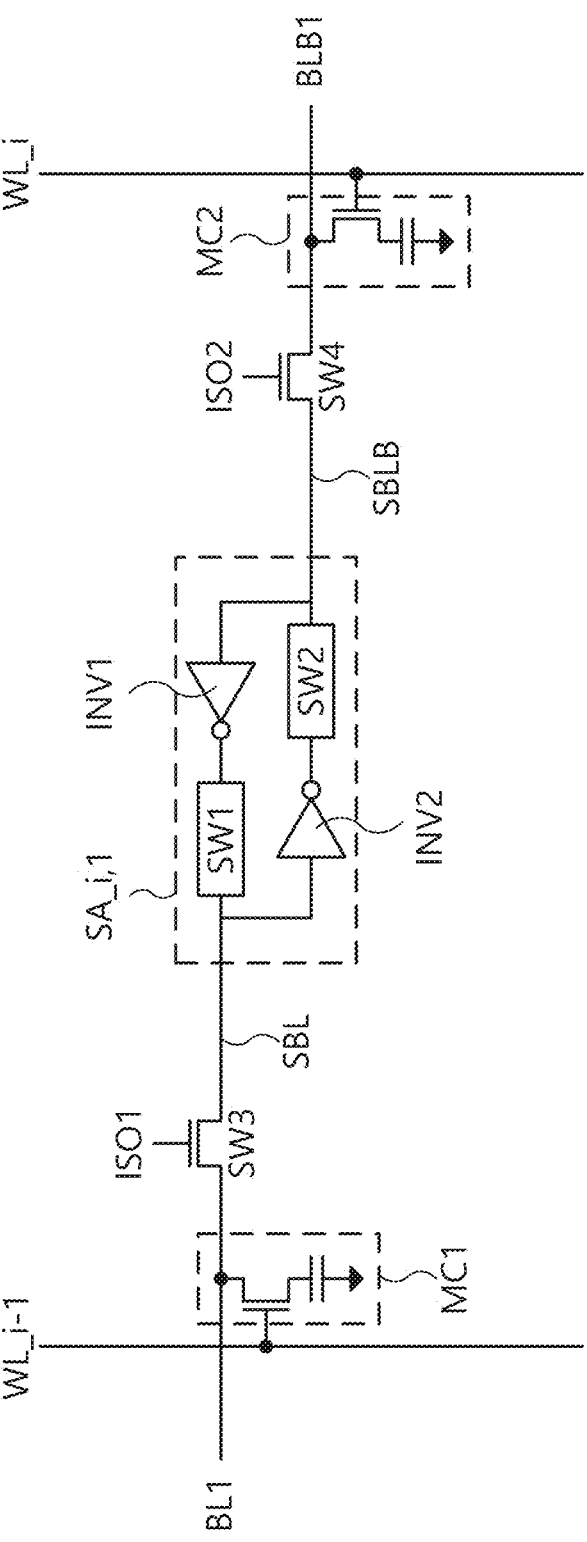
FIG. 5 is a diagram illustrating one sense amplifier of FIG. 4.

FIG. 3 is a diagram illustrating a connection between a memory cell array and a bitline sense amplifier of FIG. 2. FIG. 4 is a diagram illustrating a connection between a memory cell block and a sense amplifier group in FIG. 3. FIG. 5 is a diagram illustrating one sense amplifier of FIG. 4. Referring to FIGS. 2 to 5, the memory cell array 1210 may include a plurality of memory cell blocks (CB_1 to CB_n) and a plurality of sense amplifier blocks (SG_1 to SG_n+1) (where n is a natural number). Each sense amplifier block SG_i may correspond to two adjacent memory cell blocks (CB_i–1, CB_i) among the plurality of memory cell blocks (CB_1 to CB_n), and may be connected to the two adjacent memory cell blocks (CB_i–1, CB_i) (where i is a natural number of 2 or more).

According to an example embodiment, each memory cell block CB_i may include a plurality of bitlines BL extending in a predetermined direction (for example, column direction). A plurality of memory cells may be connected to each bitline BL. The memory cell block CB_i may further include a plurality of word lines WL extending in different directions (for example, row direction). A plurality of memory cells MC connected to each bitline BL may be respectively connected to a plurality of word lines WL.

In some example embodiments, as illustrated in FIG. 3, some of the memory cell blocks (CB_1 to CB_n) may include complementary bitlines BLB as bitlines. In some example embodiments, memory cell blocks on which bitlines BL are formed and memory cell blocks on which complementary bitlines BLB are formed may be arranged alternately, and the bitlines BL and complementary bitlines BLB may form a complementary bitline pair.

According to an example embodiment, the sense amplifier block SG_i may be connected to some bitlines BL of one memory cell block CB_i–1 and some complementary bitlines BLB of another memory cell block CB_i. As an example, the sense amplifier block SG_i may be connected to an odd bitline BL of the memory cell block CB_i–1 and an odd complementary bitline BLB of the memory cell block CB_i. In some example embodiments, an even bitline BL of the memory cell block CB_i–1 may be connected to another sense amplifier block SG_i–1, and an even complementary bitline BLB of the memory cell block CB_i may be connected to another sense amplifier block SG_i–1. As another example, the sense amplifier block SG_i may be connected to the even bitline BL of the memory cell block CB_i–1 and the even complementary bitline BLB of the memory cell block CB_i.

According to an example embodiment, the sense amplifier block SG_1 located at an end may be connected to the bitline BL of one memory cell CB_1, and the sense amplifier block SG_n+1 located at the other end may be connected to one memory cell CB_1.

According to an example embodiment, the sense amplifier block SG_i may include a plurality of sense amplifiers SA. The plurality of sense amplifiers SA may each correspond to some bitlines BL of the memory cell block CB_i–1 and may each correspond to some complementary bitlines BLB of the other memory cell block CB_i. Each sense amplifier SA may be connected to a corresponding bitline BL among some bitlines (for example, odd bitlines) BL of the memory cell block CB_i−1 and a corresponding complementary bitline BLB among some complementary bitlines (for example, odd complementary bitlines) BLB of the other memory cell block CB_i.

As illustrated in FIG. 4, the bitlines BL1 and BL3 in the cell array block CB_i−1 may be respectively connected to the sense amplifiers (SA_i,1) and SA_i,2 of the sense amplifier block SG_i. The bitlines BL2 and BL4 may be respectively connected to the sense amplifiers SA_i−1,1 and SA_i−1,2 of the sense amplifier block SG_i−1. For convenience of explanation, one word line WL and a memory cell MC connected to the word line WL are illustrated in FIG. 4. In addition, although each memory cell MC is illustrated in FIG. 4 as including a transistor and a capacitor, a structure of the memory cell MC is not limited to thereto.

Referring to FIG. 5, one sense amplifier (SA_i,1) may be connected to one bitline BL and one complementary bitline BLB1. In FIG. 5, for convenience of explanation, one memory cell MC1 connected to the bitline BL1, one word line WL_i−1 to the memory cell MC1, one memory cell MC2 connected to the complementary bitline BLB1, and one word line WL_i connected to the memory cell MC2 are illustrated. In addition, although each memory cell MC1 and MC2 is illustrated in FIG. 5 as including a transistor and a capacitor, a structure of each memory cell MC1 and MC2 is not limited thereto.

For example, the sense amplifier (SA_i,1) may include a first inverter INV1 and a second inverter INV2. An input terminal of the first inverter INV1 may be connected to a complementary sensing bitline SBLB. An output terminal of the first inverter INV1 may be connected to a sensing bitline SBL through a first switch SW1. The sensing bitline SBL may be connected to the bitline BL1 through a third switch SW3. The bitline BL1 may be connected to the first memory cell MC1, and the first memory cell MC1 may be connected to the word line WL_i−1. An input terminal of the second inverter INV2 may be connected to the sensing bitline SBL. An output terminal of the second inverter INV2 may be connected to the complementary sensing bitline SBLB through a second switch SW2. The complementary sensing bitline SBLB may be connected to the complementary bitline BLB1 through a fourth switch SW4. The complementary bitline BLB1 may be connected to the second memory cell MC2, and the second memory cell MC2 may be connected to the word line WL_i.

According to an example embodiment, the sense amplifier (SA_i,1) may operate in a single-ended manner. For example, the third switch SW3 may electrically isolate the sense amplifier (SA_i,1) from the bitline BL1 based on a first isolation signal ISO1. When the first isolation signal ISO1 is at an inactive level (for example, low level), the third switch SW3 may electrically isolate the sense amplifier (SA_i,1) from the bitline BL1. When the first isolation signal ISO1 is at an active level (for example, high level), the third switch SW3 may connect the sense amplifier (SA_i,1) to the bitline BL1.

Additionally, the fourth switch SW4 may electrically isolate the sense amplifier (SA_i,1) from the complementary bitline BLB1 based on a second isolation signal ISO2. When the second isolation signal ISO2 is at an inactive level (for example, low level), the fourth switch SW4 may electrically isolate the sense amplifier (SA_i,1) from the complementary bitline BLB1. When the second isolation signal ISO2 is at an active level (for example, high level), the fourth switch SW4 may connect the sense amplifier (SA_i,1) to the complementary bitline BLB1.

Therefore, according to the first isolation signal ISO1 and the second isolation signal ISO2, the sense amplifier (SA_i, 1) may be connected to one of the first memory cell MC1 included in one memory cell block CB_i−1 or the second memory cells MC2 included in another memory cell block CB_i. During an active operation or a refresh operation, the sense amplifier (SA_i,1), which operates in a single-ended manner, may consume more current from memory cells storing a high level (or logic 1) than from memory cells storing a low level (or logic 0).

Figure 6:
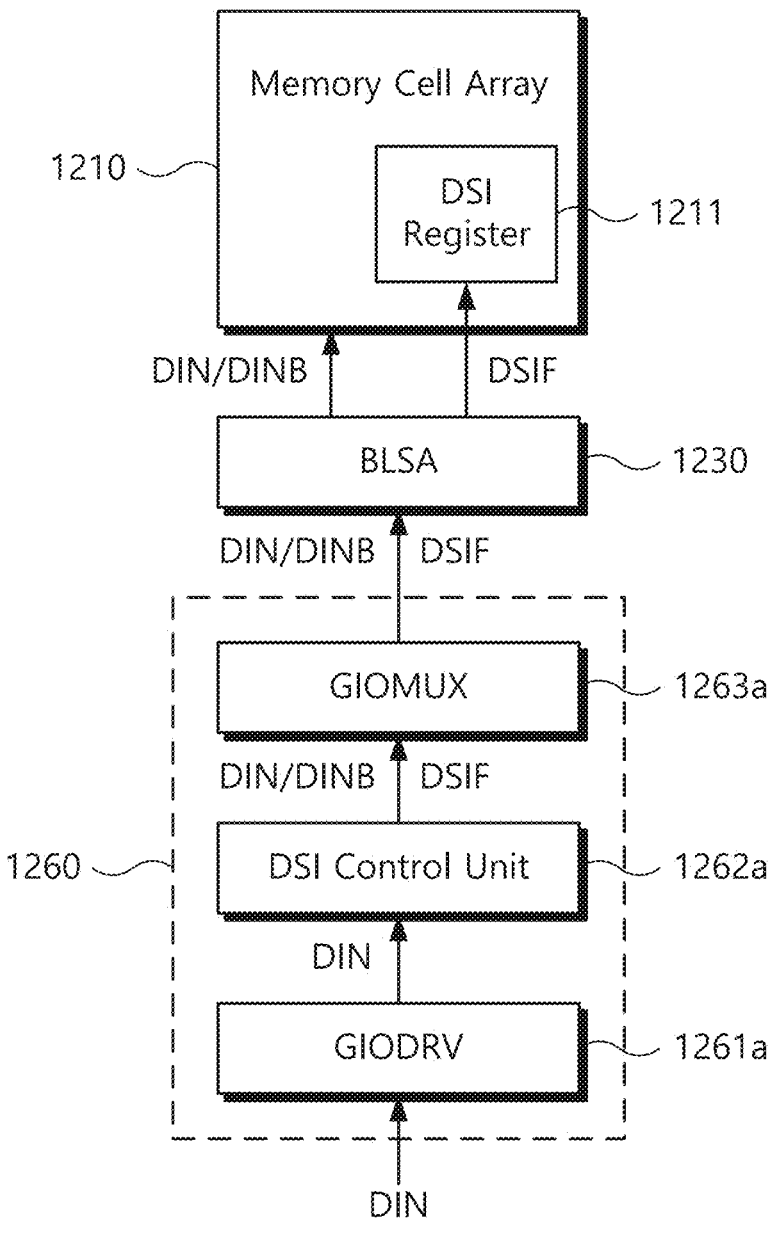
FIG. 6 is a diagram illustrating an example of a data storage method of a memory device of FIG. 2.

FIG. 6 is a diagram illustrating an example of a data storage method of a memory device of FIG. 2. Referring to FIGS. 2 and 6, the memory device 1200 may biasedly convert input data and store biased data. The DSI circuit 1260 may include a global input/output driver 1261a, a DSI control unit 1262a, and a global input/output multiplexer 1263a. The DSI control unit 1262a may be placed between the global input/output driver 1261a and the global input/output multiplexer 1263a.

According to an example embodiment, the DSI circuit 1260 may determine the majority of the logic level of input data DIN. Based on the determination result, the DSI circuit 1260 may generate a data inversion flag DSIF indicating which inverted data is stored in the memory cell array 1210. For example, the global input/output driver 1261a may amplify the input data DIN and transmit amplified data of the input data DIN to the DSI control unit 1262a. The DSI control unit 1262a may determine the majority of the logic levels of the input data DIN.

As an example, the DSI control unit 1262a may check the number of logic 1s (for example, high level) included in the input data DIN. When the number of logic 1s included in the input data DIN is less than or equal to half the number of bits included in the input data DIN, the DSI control unit 1262a may transfer the input data DIN as-is to the global input/output multiplexer 1263a. The global input/output multiplexer 1263a may transfer the input data DIN to the bitline sense amplifier 1230, and the bitline sense amplifier 1230 may store the input data DIN in the memory cell array 1210.

When the number of logic 1s included in the input data DIN is greater than half (or a majority) of the number of bits included in the input data DIN, the DSI control unit 1262a may generate a data inversion flag DSIF. The DSI control unit 1262a may invert the input data DIN and transmit complementary input data DINB along with the data inversion flag DSIF to the global input/output multiplexer 1263a. The global input/output multiplexer 1263a may transmit the complementary input data DINB and the data inversion flag DSIF to the bitline sense amplifier 1230.

The bitline sense amplifier 1230 may store the complementary input data DINB in the memory cell array 1210. The bitline sense amplifier 1230 may store the data inversion flag DSIF in a DSI register 1211 included in the memory cell array 1210. The memory device 1200 may allocate a portion of the memory cell array 1210 to the DSI register 1211. During a read operation of the complementary input data DINB, the bitline sense amplifier 1230 may read the data inversion flag DSIF, and the DSI control unit 1262a may restore the complementary input data DINB to the input data DIN and output the restored input data DIN through the input/output circuit 1270.

As another example, the DSI control unit 1262a may check the number of logic 0s (for example, low level) included in the input data DIN. When the number of logic 0s included in the input data DIN is less than or equal to half the number of bits included in the input data DIN, the DSI control unit 1262a may transfer the input data DIN as is to the global input/output multiplexer 1263a. The global input/output multiplexer 1263a may transfer the input data DIN to the bitline sense amplifier 1230, and the bitline sense amplifier 1230 may store the input data DIN in the memory cell array 1210.

When the number of logic 0s included in the input data DIN is greater than half (or a majority) of the number of bits included in the input data DIN, the DSI control unit 1262a may generate a data inversion flag DSIF. The DSI control unit 1262a may invert the input data DIN and transmit complementary input data DINB along with the data inversion flag DSIF to the global input/output multiplexer 1263a. The global input/output multiplexer 1263a may transmit the complementary input data DINB and the data inversion flag DSIF to the bitline sense amplifier 1230.

The bitline sense amplifier 1230 may store the complementary input data DINB in the memory cell array 1210. The bitline sense amplifier 1230 may store the data inversion flag DSIF in the DSI register 1211 included in the memory cell array 1210. The memory device 1200 may allocate a portion of the memory cell array 1210 to the DSI register 1211.

As described above, the memory device 1200 may store the input data DIN as-is or invert it depending on the logic level of the bits included in the input data DIN. Accordingly, the bit levels of data stored in the memory cell array 1210 may be configured to be biased (for example, to have a large number of logic 0s or a large number of logic 1s). The memory device 1200 may determine whether to invert the input data DIN based on which bit level will result in the bitline sense amplifier 1230 consuming more power during operation in a single-ended manner during an active operation or a refresh operation.

For example, when logic 1 (or high level) is stored in the memory cell array 1210 and the amount of current consumed by the bitline sense amplifier 1230 during an active operation or a refresh operation is large, the DSI control unit 1262a may invert the input data DIN and generate the data inversion flag DSIF when the number of logic 1s contained in the input data DIN is greater than half (or a majority) of the number of bits contained in the input data DIN.

As another example, when logic 0 (or low level) is stored in the memory cell array 1210 and the amount of current consumed by the bitline sense amplifier 1230 during an active operation or a refresh operation is large, the DSI control unit 1262a may invert the input data DIN and generate the data inversion flag DSIF when the number of logic 0s contained in the input data DIN is greater than half (or a majority) of the number of bits contained in the input data DIN.

Hereinafter, for convenience of explanation, it is assumed that the amount of current consumed by the bitline sense amplifier 1230 during active operation or refresh operation is large when logic 1 (or high level) is stored in the memory cell array 1210. However, the data inversion storage method of the present disclosure may be applied even when a logic 0 (or low level) is stored in the memory cell array 1210 and the amount of current consumed by the bitline sense amplifier 1230 during active operation or refresh operation is large.

Figure 7:
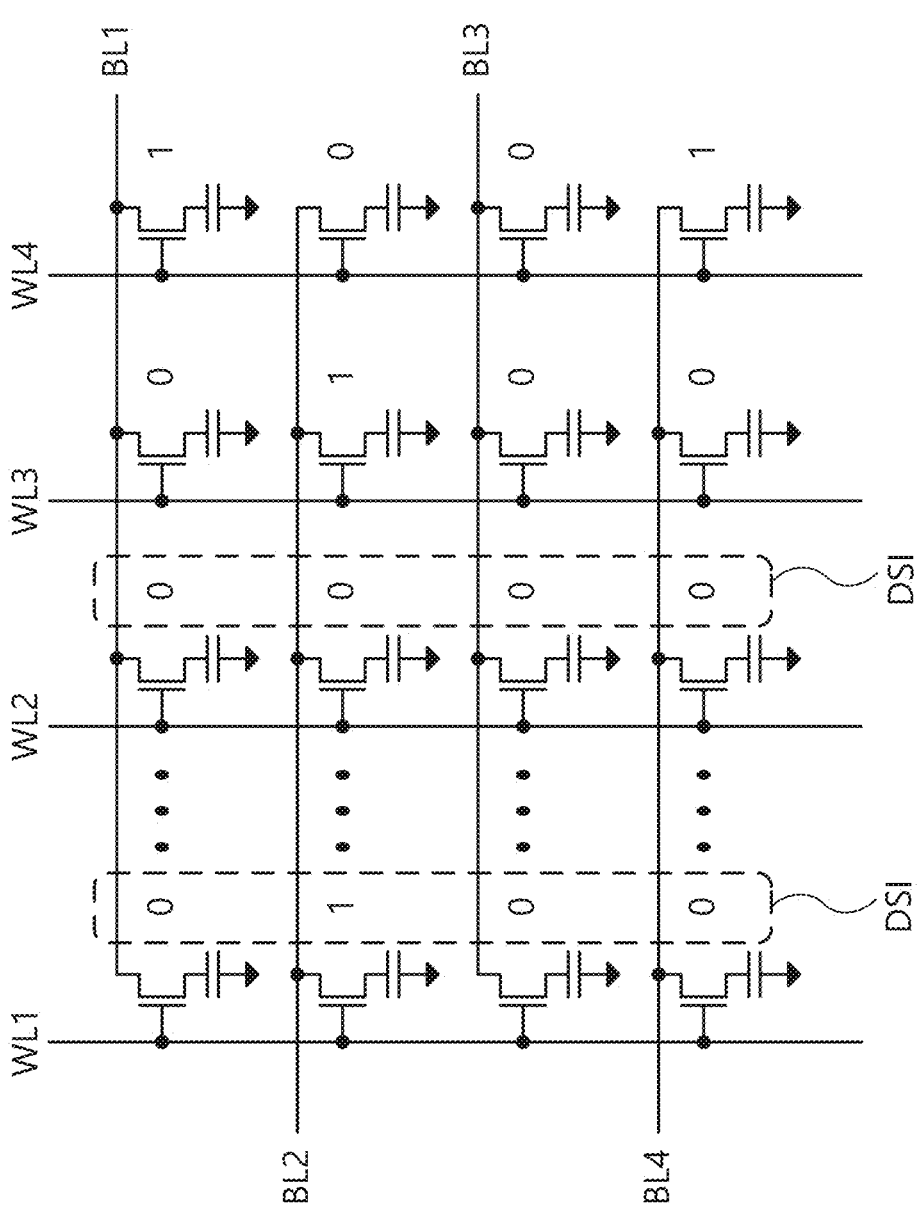
FIG. 7 is a diagram illustrating data stored in a memory cell array according to a data storage method of FIG. 6.

FIG. 7 is a diagram illustrating data stored in a memory cell array according to a data storage method of FIG. 6. FIG. 7 exemplarily illustrates a memory cell array 1210 connected to the bitline sense amplifier 1230 through four bitlines. Referring to FIGS. 6 and 7, the memory device 1200 may receive "1101", "1111", "0010", and "1001" as input data DIN.

According to the data storage method of FIG. 6, the input data "1101" may be inverted because the number of logic 1s is more than half, and stored as "0010" in the memory cells connected to a first word line WL1. Since the number of logic 1s is more than half, the input data "1111" may be inverted and stored as "0000" in the memory cells connected to a second word line WL2. The input data "0010" may not be inverted because the number of logic 1s is less than the majority, and may be stored as "0010" in memory cells connected to a third word line WL3. The input data "1001" may not be inverted because the number of logic 1s is less than the majority, and may be stored as "1001" in memory cells connected to a fourth word line WL4.

Accordingly, the memory cell array 1210 may store a greater number of logic 0s (for example, second level) than logic 1s (for example, first level) as a whole. That is, the memory cell array 1210 may store input data such that the logic level is biased. Accordingly, the bitline sense amplifier 1230 operating in a single-ended manner may reduce current consumption during an active operation or a refresh operation.

Figure 8:
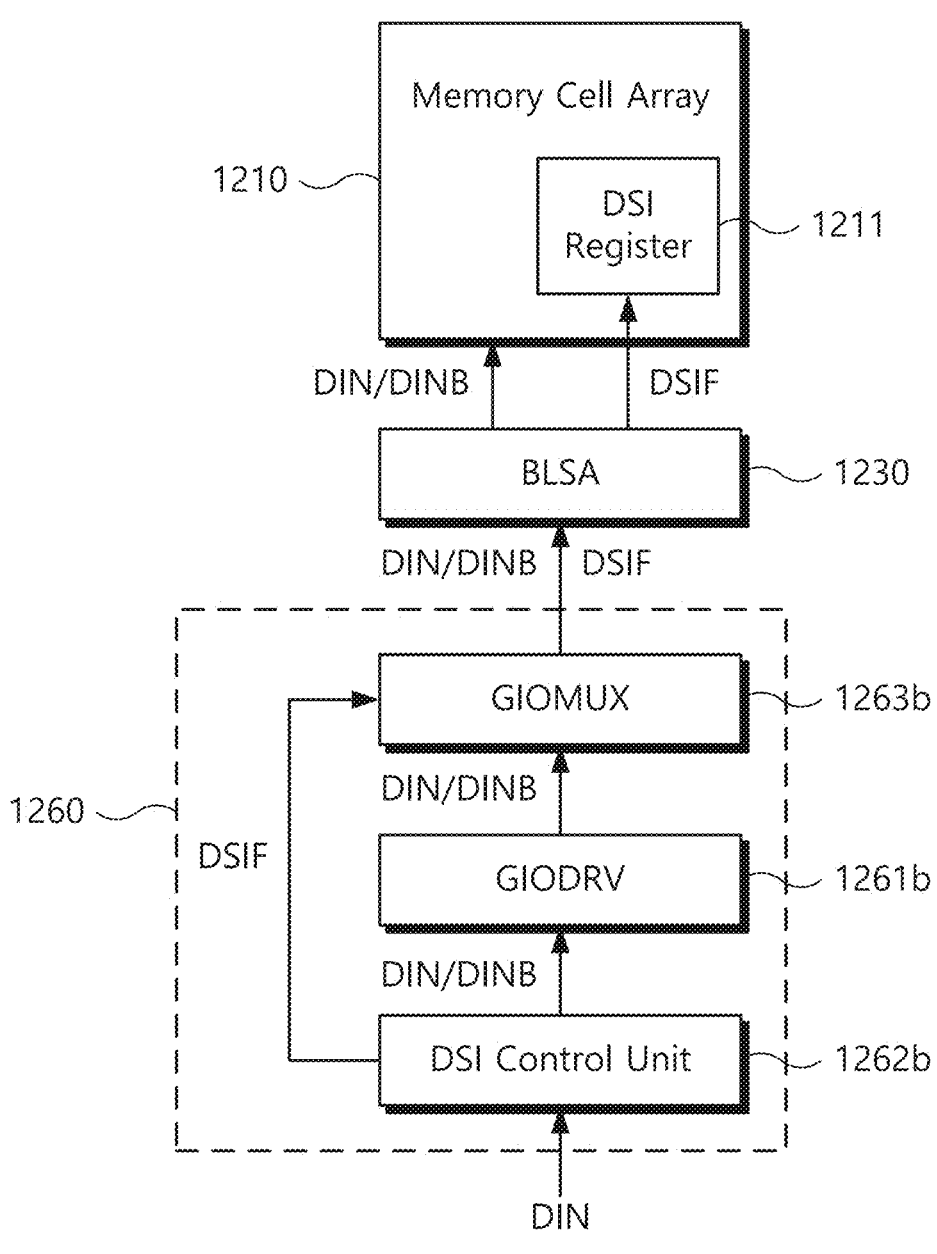
FIG. 8 is a diagram illustrating another example of a data storage method of a memory device of FIG. 2.

FIG. 8 is a diagram illustrating another example of a data storage method of a memory device of FIG. 2. Referring to FIGS. 2 and 8, the memory device 1200 may biasedly convert input data and store biased data. The DSI circuit 1260 may include a global input/output driver 1261b, a DSI control unit 1262b, and a global input/output multiplexer 1263b. The DSI control unit 1262b may be placed in front of the global input/output driver 1261b.

According to an example embodiment, the DSI circuit 1260 may determine the majority of the logic level of the input data DIN and generate a data inversion flag DSIF based on the determination result. For example, the DSI control unit 1262b may determine the majority of the logic level (for example, logic 1) of the input data DIN. The DSI control unit 1262b may check the number of logic 1s (for example, high level) included in the input data DIN.

When the number of logic 1s included in the input data DIN is less than or equal to half the number of bits included in the input data DIN, the DSI control unit 1262b may transfer the input data DIN as is to the global input/output driver 1261b. The global input/output driver 1261b may amplify the input data DIN and transmit amplified data of the input data DIN to the global input/output multiplexer 1263b. The global input/output multiplexer 1263b may transfer the input data DIN to the bitline sense amplifier 1230, and the bitline sense amplifier 1230 may store the input data DIN in the memory cell array 1210.

When the number of logic 1s included in the input data DIN is greater than half (or a majority) of the number of bits included in the input data DIN, the DSI control unit 1262b may generate a data inversion flag DSIF. The DSI control unit 1262b may transmit the data inversion flag DSIF to the global input/output multiplexer 1263b. The DSI control unit 1262b may invert the input data DIN and transmit complementary input data DINB to the global input/output driver 1261b. The global input/output driver 1261b may amplify the complementary input data DINB and transmit amplified data of the complementary input data DINB to the global input/output multiplexer 1263b. The global input/output multiplexer 1263b may transmit the complementary input data DINB and the data inversion flag DSIF to the bitline sense amplifier 1230.

The bitline sense amplifier 1230 may store complementary input data DINB in the memory cell array 1210. The bitline sense amplifier 1230 may store the data inversion flag DSIF in a DSI register 1211 included in the memory cell array 1210. The memory device 1200 may allocate a portion of the memory cell array 1210 to the DSI register 1211.

During a read operation of the complementary input data DINB, the bitline sense amplifier 1230 may read the data inversion flag DSIF. The DSI control unit 1262*b* may restore the complementary input data DINB to the input data DIN and output the restored input data DIN through the input/output circuit 1270.

Figure 9:
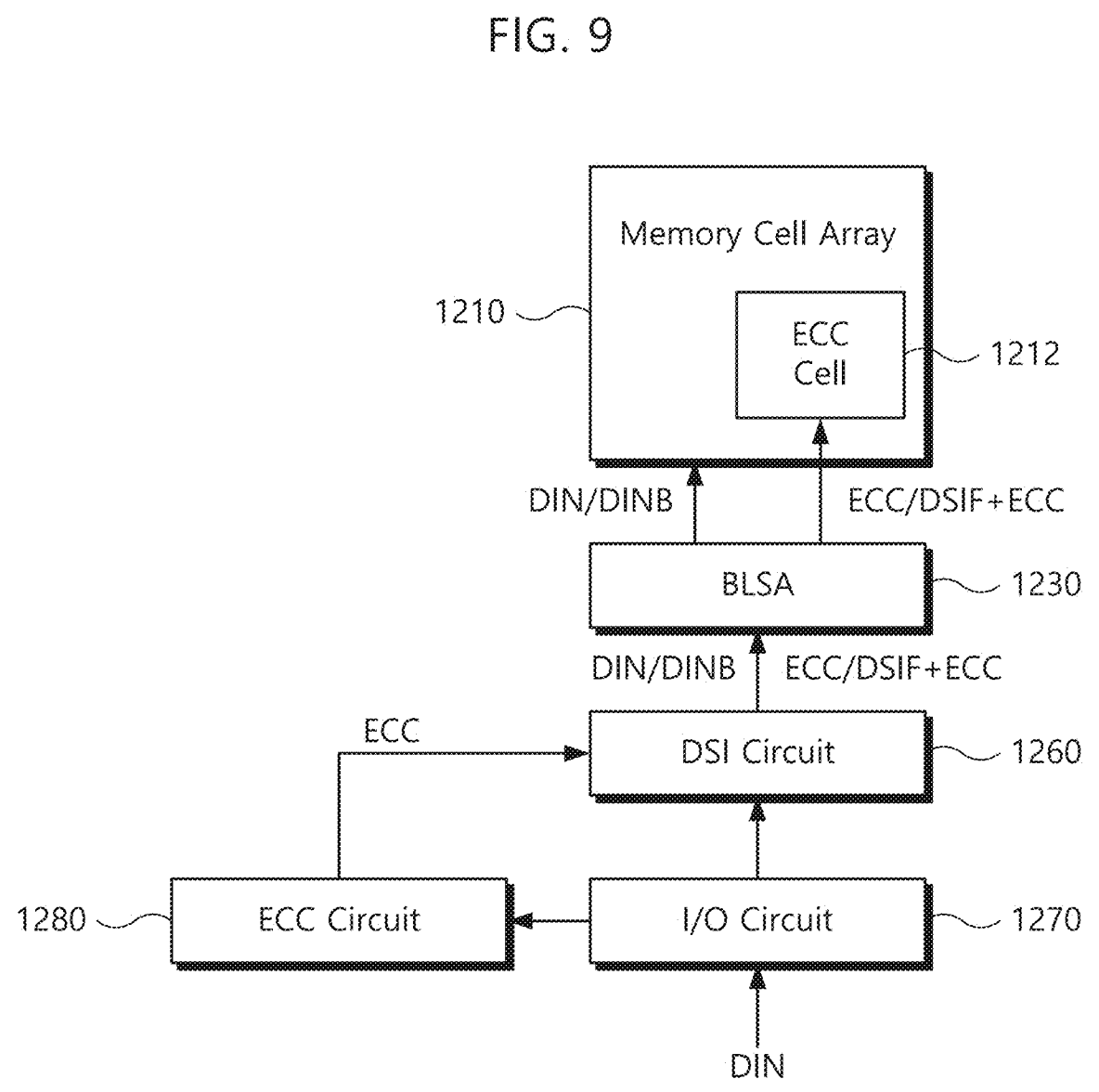

FIG. 9 is a diagram illustrating another example of a data storage method of a memory device of FIG. 2. Referring to FIGS. 2 and 9, the memory device 1200 may further include an error correction circuit 1280. The memory cell array 1210 may include error correction code cells 1212 which store an error correction code ECC generated by the error correction circuit 1280.

In various example embodiments the error correction circuit 1280 can be configured to implement block ECCs and/or convolutional ECCs. Block ECCs are often used in conjunction with fixed-size blocks of bits, or symbols of predetermined size. Convolutional ECCs are often used for bit or symbol streams of arbitrary length. Examples of block ECCs include Reed-Solomon, Golay, BCH, Multidimensional parity, and Hamming codes. Convolutional ECCs include, but are not limited to, Viterbi algorithms. According to an example embodiment, the input/output circuit 1270 may transmit the received input data DIN to the error correction circuit 1280. For example, the error correction circuit 1280 may generate an error correction code ECC based on the input data DIN. The error correction circuit 1280 may transmit an error correction code ECC to the DSI circuit 1260.

According to an example embodiment, the input/output circuit 1270 may transfer the received input data DIN to the DSI circuit 1260. For example, the DSI circuit 1260 may determine the majority of the logic level (for example, logic 1) of the input data DIN.

When the number of logic 1s included in the input data DIN is less than or equal to half the number of bits included in the input data DIN, the DSI circuit 1260 may invert the input data DIN as is to the bitline sense amplifier 1230. At this time, the DSI circuit 1260 may transmit the error correction code ECC along with the input data DIN to the bitline sense amplifier 1230. The bitline sense amplifier 1230 may store the input data DIN in the memory cell array 1210. The bitline sense amplifier 1230 may store the error correction code ECC in the error correction code cells 1212.

When the number of logic 1s included in the input data DIN is greater than half (or a majority) of the number of bits included in the input data DIN, the DSI circuit 1260 may generate a data inversion flag DSIF. Additionally, the DSI circuit 1260 may invert the input data DIN and transmit complementary input data DINB to the bitline sense amplifier 1230. The DSI circuit 1260 may combine the data inversion flag DSIF and the error correction code ECC and transmit combined data of the data inversion flag DSIF and the error correction code ECC to the bitline sense amplifier 1230.

The bitline sense amplifier 1230 may store the complementary input data DINB in the memory cell array 1210. The bitline sense amplifier 1230 may store the combined data of the data inversion flag DSIF and the error correction code ECC in the error correction code cells 1212.

During a read operation of the complementary input data DINB, the bitline sense amplifier 1230 may read the data inversion flag DSIF together, and the DSI circuit 1260 may restore the complementary input data DINB to the input data DIN and output the restored input data DIN through the input/output circuit 1270.

Figure 10:
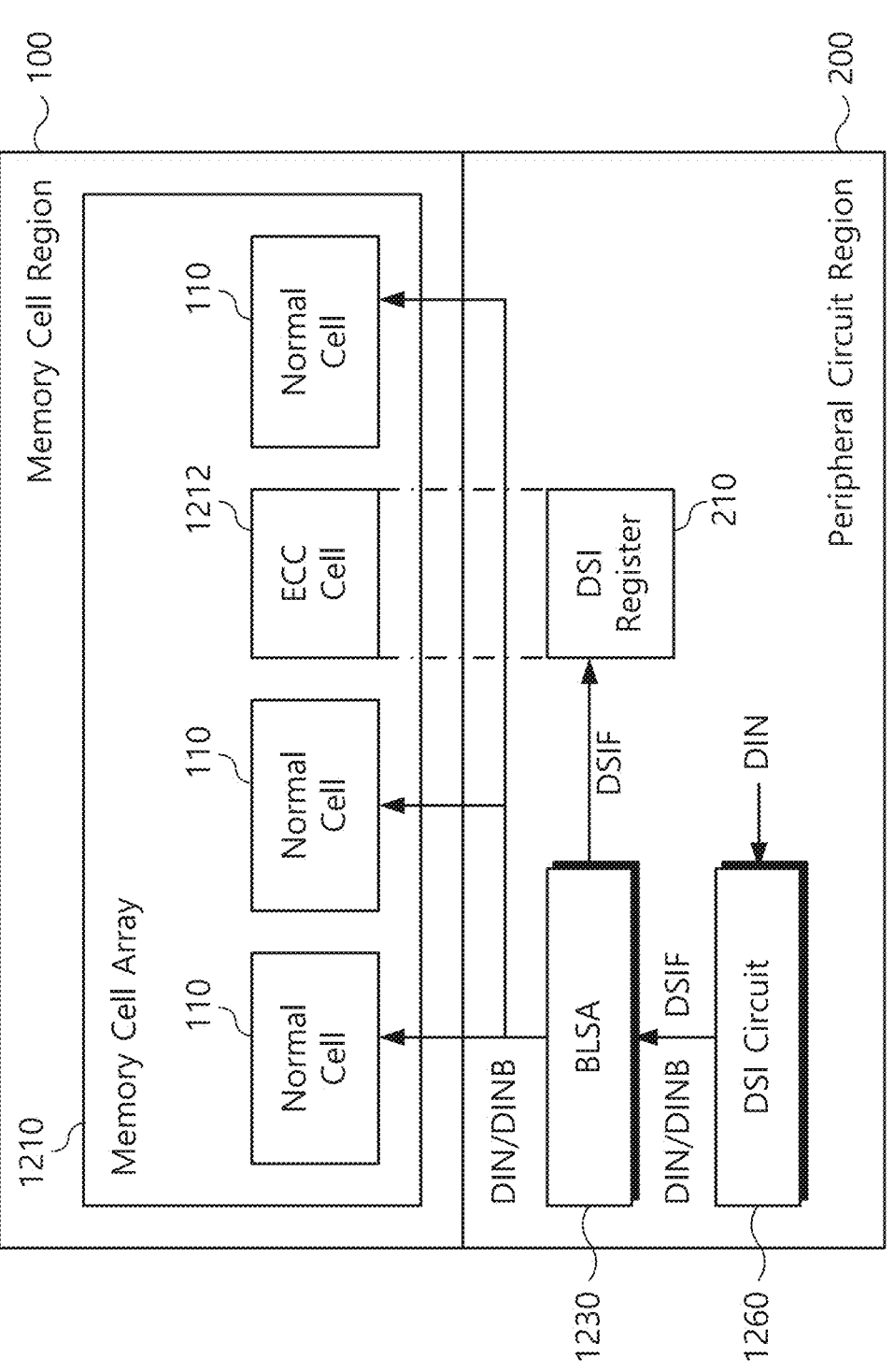
FIG. 10 is a diagram illustrating another example of a data storage method of a memory device of FIG. 2.

FIG. 10 is a diagram illustrating another example of a data storage method of a memory device of FIG. 2. Referring to FIGS. 2, 9, and 10, the memory device 1200 may have a cell over periphery (COP) structure in which a memory cell region 100 is stacked on a peripheral circuit region 200.

According to an example embodiment, the memory cell area 100 may include a memory cell array 1210. The memory cell array 1210 may include normal cells 110 and error correction code cells 1212. The peripheral circuit area 200 may include an address buffer 1220, a row decoder 1221, a column decoder 1222, a bitline sense amplifier 1230, a command decoder 1240, a control logic 1250, and a data inversion storage circuit 1260, an input/output circuit 1270 of FIG. 2, or an error correction circuit 1280 of FIG. 9.

Additionally, the peripheral circuit area 200 may include a DSI register 210. The DSI register 210 may be placed below the error correction code cells 1212. However, in FIG. 10, for convenience of explanation, the address buffer 1220, the row decoder 1221, the column decoder 1222, the command decoder 1240, the control logic 1250, the input/output circuit 1270, and the error correction circuit 1280 are not illustrated.

According to an example embodiment, the DSI circuit 1260 may determine the majority of the logic level (for example, logic 1) of the input data DIN. For example, When the number of logic 1s included in the input data DIN is less than or equal to half the number of bits included in the input data DIN, the DSI circuit 1260 may transmit the input data DIN as is to the line sense amplifier 1230. The bitline sense amplifier 1230 may store input data DIN in normal cells 110 of the memory cell array 1210.

When the number of logic 1s included in the input data DIN is greater than half (or a majority) of the number of bits included in the input data DIN, the DSI circuit 1260 may generate a data inversion flag DSIF. Additionally, the DSI circuit 1260 may invert the input data DIN and transmit complementary input data DINB to the bitline sense amplifier 1230 along with the data inversion flag DSIF.

The bitline sense amplifier 1230 may store the complementary input data DINB in the normal cells 110 of the memory cell array 1210. The bitline sense amplifier 1230 may store the data inversion flag DSIF in the DSI register 210 of the peripheral circuit area 200. During a read operation of the complementary input data DINB, the bitline sense amplifier 1230 may read the data inversion flag DSIF together, and the DSI circuit 1260 may restore the complementary input data DINB to the input data DIN and output the restored input data DIN through the input/output circuit 1270.

Figure 11:
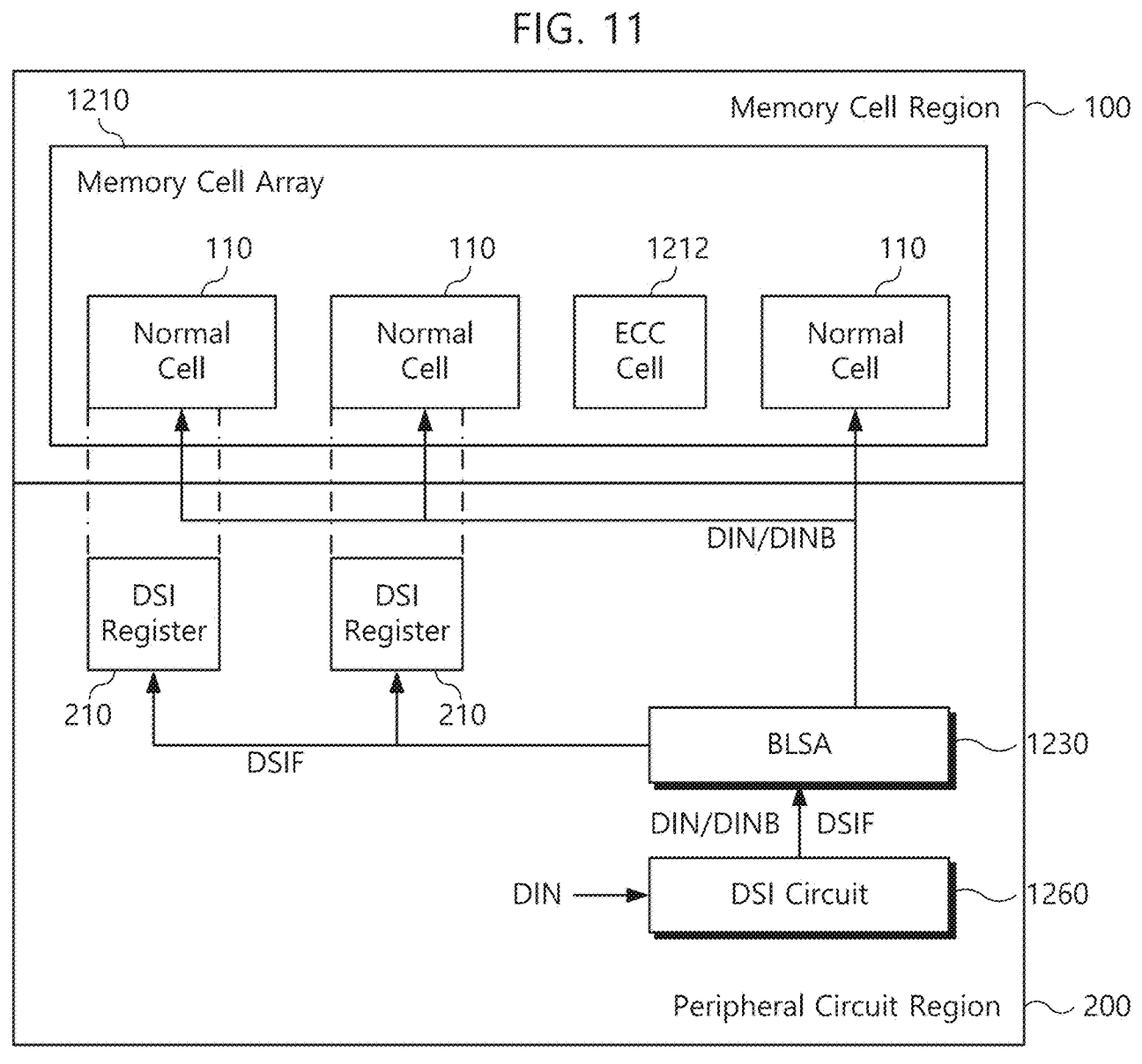

FIG. 11 is a diagram illustrating another example of a data storage method of a memory device of FIG. 2. Referring to FIGS. 2, 9, and 11, the memory device 1200 may have a cell over periphery (COP) structure in which a memory cell region 100 is stacked on a peripheral circuit region 200. The memory cell area 100 may include a memory cell array 1210.

According to an example embodiment, the memory cell array 1210 may include normal cells 110 and error correction code cells 1212. The peripheral circuit area 200 may include an address buffer 1220, a row decoder 1221, a column decoder 1222, a bitline sense amplifier 1230, a command decoder 1240, a control logic 1250, and a data inversion storage circuit 1260, an input/output circuit 1270 of FIG. 2, or an error correction circuit 1280 of FIG. 9.

Additionally, the peripheral circuit area 200 may include a DSI register 210. The DSI register 210 may be placed below the normal cells 110. The DSI register 210 may be placed below some of the plurality of normal cell groups. However, in FIG. 11, for convenience of explanation, the address buffer 1220, the row decoder 1221, the column decoder 1222, the command decoder 1240, the control logic 1250, the input/output circuit 1270, and the error correction circuit 1280 are not illustrated.

According to an example embodiment, the DSI circuit 1260 may determine the majority of the logic level (for example, logic 1) of the input data DIN. For example, when the number of logic 1s included in the input data DIN is less than or equal to half the number of bits included in the input data DIN, the DSI circuit 1260 may transmit the input data DIN as is to the line sense amplifier 1230. The bitline sense amplifier 1230 may store input data DIN in normal cells 110 of the memory cell array 1210.

When the number of logic 1s included in the input data DIN is greater than half (or a majority) of the number of bits included in the input data DIN, the DSI circuit 1260 may generate a data inversion flag DSIF. Additionally, the DSI circuit 1260 may invert the input data DIN and transmit complementary input data DINB to the bitline sense amplifier 1230 along with the data inversion flag DSIF. The bitline sense amplifier 1230 may store the complementary input data DINB in the normal cells 110 of the memory cell array 1210.

The bitline sense amplifier 1230 may store the data inversion flag DSIF in the DSI register 210 of the peripheral circuit area 200. During a read operation of the complementary input data DINB, the bitline sense amplifier 1230 may read the data inversion flag DSIF together, and the DSI circuit 1260 restore the complementary input data DINB to the input data DIN and output the restored input data DIN through the input/output circuit 1270.

Figure 12:
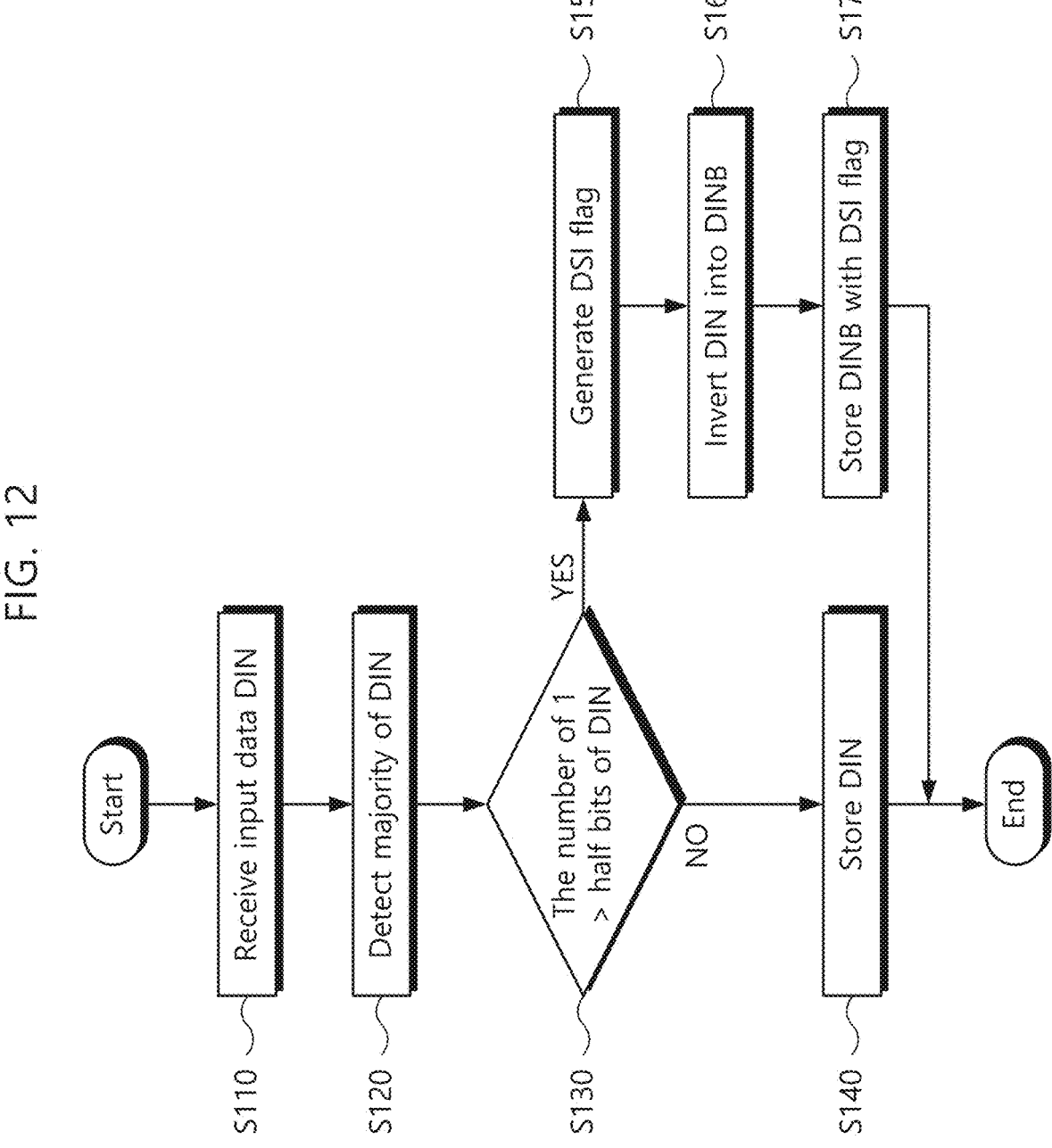
FIG. 12 is a flowchart illustrating a data storage method of a memory device of FIG. 2.

FIG. 12 is a flowchart illustrating a data storage method of a memory device of FIG. 2. Referring to FIGS. 2 to 12, the memory device 1200 may biasedly convert input data and store biased data.

According to an example embodiment, in operation S110, the memory device 1200 may receive input data DIN. For example, the input/output circuit 1270 may receive input data DIN from the memory controller 1100. The input/output circuit 1270 may transfer the received input data DIN to the DSI circuit 1260.

According to an example embodiment, in operation S120, the memory device 1200 may determine the majority of the logic levels of the bits included in the input data DIN. As an example, the DSI circuit 1260 may check the number of logic 1s (for example, high level) included in the input data DIN. As another example, the DSI circuit 1260 may check the number of logic 0s (for example, low level) included in the input data DIN.

According to an example embodiment, in operation S130, the memory device 1200 may check whether the number of logic 1s included in the input data DIN is greater than half the number of bits included in the input data DIN. For example, when the number of logic 1s included in the input data DIN is less than or equal to half the number of bits included in the input data DIN (NO in FIG. 12), the DSI circuit 1260 may perform operation S140. When the number of logic 1s included in the input data DIN is greater than half (or a majority) of the number of bits included in the input data DIN (YES in FIG. 12), the DSI circuit 1260 may perform operation S150.

According to an example embodiment, in operation S140, When the number of logic 1s included in the input data DIN is less than or equal to half the number of bits included in the input data DIN (NO in FIG. 12), the memory device 1200 may store the input data DIN as is in the memory cell array 1210. For example, the DSI circuit 1260 may directly transmit the input data DIN to the bitline sense amplifier 1230.

According to an example embodiment, in operation S150, When the number of logic 1s included in the input data DIN is greater than half (or a majority) of the number of bits included in the input data DIN (YES in FIG. 12), the memory device 1200 may generate a data inversion flag DSIF indicating which inverted data is stored in the memory cell array 1210. For example, the DSI circuit 1260 may generate a data inversion flag DSIF.

According to an example embodiment, in operation S160, the memory device 1200 may invert the input data DIN into complementary input data DINB. For example, the DSI circuit 1260 may invert the input data DIN and transmit the complementary input data DINB to the bitline sense amplifier 1230.

As an example, in FIG. 6, the DSI circuit 1260 may include a global input/output driver 1261a, a DSI control unit 1262a, and a global input/output multiplexer 1263a. The DSI control unit 1262a may be placed between the global input/output driver 1261a and the global input/output multiplexer 1263a. The DSI control unit 1262a may invert the input data DIN and output the complementary input data DINB.

As another example, in FIG. 8, the DSI circuit 1260 may include a global input/output driver 1261b, a DSI control unit 1262b, and a global input/output multiplexer 1263b. The DSI control unit 1262b may be placed in front of the global input/output driver 1261b. The DSI control unit 1262b may invert the input data DIN and output the complementary input data DINB.

According to an example embodiment, in operation S170, the memory device 1200 may store the complementary input data DINB together with the data inversion flag DSIF. For example, the bitline sense amplifier 1230 may store complementary input data DINB in the memory cell array 1210. The data inversion flag DSIF may be stored in various areas.

As an example, the bitline sense amplifier 1230 may store a data inversion flag DSIF in the DSI register 1211 included in the memory cell array 1210. As another example, the DSI circuit 1260 may combine a data inversion flag DSIF and an error correction code ECC and transmit combined data to the bitline sense amplifier 1230. The bitline sense amplifier 1230 may store the combined data of the data inversion flag DSIF and the error correction code ECC in error correction code cells 1212.

As another example, in the COP structure memory device 1200, the bitline sense amplifier 1230 may store a data inversion flag DSIF in the DSI register 210 disposed in the peripheral circuit area 200. The DSI register 210 may be disposed below the error correction code cells 1212 included in the memory cell array 1210. Alternatively, the DSI register 210 may be placed below the normal cells 110 included in the memory cell array 1210.

As described above, the memory device 1200 may store data in the memory cell array 1210 such that more memory cells storing a low level (or logic 0) (for example, a second level) than memory cells storing a high level (or logic 1) (for example, a first level). That is, the memory cell array 1210 may store data such that the logic level stored in the memory cell array 1210 is biased. During an active operation or a refresh operation, the bitline sense amplifier 1230, which operates in a single-ended manner, may consume more current from memory cells storing a high level (or logic 1) than from memory cells storing a low level (or logic 0).

Accordingly, when the number of memory cells storing a low level (or logic 0) is greater than the number of memory cells storing a high level (or logic 1) in the memory cell array 1210 (or a low level (or logic 0) is stored biased in the memory cell array 1210), the bitline sense amplifier 1230 operating in a single-ended manner may reduce current consumption during an active operation or a refresh operation.

According to the present disclosure, it may be possible to reduce current consumed in a bitline sense amplifier during a read operation or a refresh operation by storing input data in a memory cell array such that a logic level of the input data is biased.

While the present disclosure has been described with reference to embodiments thereof, it will be apparent to those of ordinary skill in the art that various changes and modifications may be made thereto without departing from the spirit and scope of the present disclosure as set forth in the following claims.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

In various example embodiments herein, reference may have been made to various circuit elements, including but not limited to capacitors, resistor, inductors, switches, amplifiers, comparators, filters, and transistors. Various different types of digital, analog, active and/or passive components are available for use in implementing the example embodiments. For example, different transistor types can be used depending on whether positive or negative logic is used, manufacturing processes employed, or the like. Furthermore, unless specifically stated otherwise herein, there are many available types of filters, comparators, switches, and the like that can be used to implement the example embodiments.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof.

What is claimed is:

1. A memory device comprising:
a memory cell array including a plurality of memory cells;
a single-ended bitline sense amplifier connected to the plurality of memory cells through a bitline and a complementary bitline, and electrically connected through one of the bitline or the complementary bitline in response to the plurality of memory cells being activated; and a DSI circuit configured to
transmit, to the single-ended bitline sense amplifier, complementary input data generated by inverting input data to the single-ended bitline sense amplifier in response to a first number of bits included in the input data having a first level greater than a second number of bits included in the input data having a second level,
generate a data inversion flag indicating that the input data is inverted in response to the first number of bits included in the input data having the first level greater than the second number of bits included in the input data having the second level, and
transmit the data inversion flag to the single-ended bitline sense amplifier,
wherein the single-ended bitline sense amplifier is configured to store the complementary input data in the memory cell array and to receive and store the data inversion flag in a specified partial area of the memory cell array.

2. The memory device of claim 1, wherein the DSI circuit is configured to transmit the input data as-is to the single-ended bitline sense amplifier in response to the first number of bits having the first level being less than or equal to the second number of bits having the second level, and
wherein the single-ended bitline sense amplifier is configured to store the input data as-is in the memory cell array.

3. The memory device of claim 1, wherein the first level is a high level, and
wherein the second level is a low level.

4. The memory device of claim 1, wherein the DSI circuit comprises:
a global input/output driver configured to amplify and output the input data;
a DSI control unit configured to generate the data inversion flag and invert the input data to generate the complementary input data in response to the first number of bits having the first level being greater than the second number of bits having the second level; and
a global input/output multiplexer configured to transmit the input data to the single-ended bitline sense amplifier or transmit the complementary input data and the data inversion flag to the single-ended bitline sense amplifier based on whether the DSI control unit generated the complementary input data,
wherein the DSI control unit is disposed between the global input/output driver and the global input/output multiplexer.

5. The memory device of claim 1, wherein the DSI circuit comprises:
a DSI control unit configured to generate the data inversion flag and invert the input data into the complementary input data in response to the first number of bits having the first level being greater than the second number of bits having the second level;
a global input/output driver configured to amplify and output data received from the DSI control unit; and
a global input/output multiplexer configured to transmit the input data to the single-ended bitline sense amplifier or transmit the complementary input data and the data inversion flag to the single-ended bitline sense amplifier based on whether the DSI control unit transmitted the data inversion flag to the global input/output multiplexer, wherein the DSI control unit is disposed in front of the global input/output driver and is configured to transmit the data inversion flag to the global input/output multiplexer.

6. The memory device of claim 1, further comprising:

an error correction circuit configured to generate an error correction code based on the input data, wherein the DSI circuit is configured to transmit combined data of the data inversion flag and the error correction code to the single-ended bitline sense amplifier in response to the first number of bits having the first level being greater than the second number of bits having the second level, and wherein the single-ended bitline sense amplifier is configured to store the combined data in error correction code cells included in the memory cell array.

7. The memory device of claim 1, wherein the single-ended bitline sense amplifier is configured to store the data inversion flag in a DSI register separately specified in the memory cell array.

8. The memory device of claim 1, wherein the single-ended bitline sense amplifier comprises:

a first inverter including a first output terminal connected to a sensing bitline through a first switch and a first input terminal connected to a complementary sensing bitline; and a second inverter including a second output terminal connected to the complementary sensing bitline through a second switch and a second input terminal connected to the sensing bitline, wherein the sensing bitline is connected to the bitline through a third switch, wherein the complementary sensing bitline is connected to the complementary bitline through a fourth switch, wherein electrical connection with the complementary bitline is cut off by the fourth switch in response to a first memory cell connected to the bitline being activated, and wherein electrical connection with the bitline is cut off by the third switch in response to a second memory cell connected to the complementary bitline being activated.

9. D) A memory device comprising:

a peripheral circuit area; and a memory cell area stacked on the peripheral circuit area, wherein the memory cell area comprises a memory cell array including normal memory cells and error correction code cells, wherein the peripheral circuit area comprises:

a single-ended bitline sense amplifier connected to the memory cell array through a bitline and a complementary bitline, and electrically connected through one of the bitline and the complementary bitline when the memory cell array is activated;

a DSI circuit configured to transmit, the single-ended bitline sense amplifier, complementary input data generated by inverting input data to the single-ended bitline sense amplifier in response to a first number of bits included in the input data having a first level greater than a second number of bits included in the input data having a second level, and generate a data inversion flag indicating that the input data is inverted in response to the first number of bits included in the input data having the first level greater than the second number of bits included in the input data having the second level, and transmit the data inversion flag to the single-ended bitline sense amplifier; and a DSI register configured to store the data inversion flag, wherein the single-ended bitline sense amplifier is configured to store the complementary input data in the memory cell array and receive and store the data inversion flag in the DSI register.

10. The memory device of claim 9, wherein the DSI register is disposed below the error correction code cells.

11. The memory device of claim 9, wherein the DSI register is disposed in a lower portion of the normal memory cells.

12. The memory device of claim 9, wherein the DSI circuit comprises:

a global input/output driver configured to amplify and output the input data;

a DSI control unit configured to generate the data inversion flag and invert the input data into the complementary input data in response to the first number of bits having the first level being greater than the second number of bits having the second level; and a global input/output multiplexer configured to transmit the input data to the single-ended bitline sense amplifier or transmit the complementary input data and the data inversion flag to the single-ended bitline sense amplifier based on whether the DSI control unit generated the complementary input data, wherein the DSI control unit is disposed between the global input/output driver and the global input/output multiplexer.

13. The memory device of claim 9, wherein the DSI circuit comprises:

a DSI control unit configured to generate the data inversion flag and invert the input data into the complementary input data in response to the first number of bits having the first level being greater than the second number of bits having the second level;

a global input/output driver configured to amplify and output data received from the DSI control unit; and a global input/output multiplexer configured to transmit the input data to the single-ended bitline sense amplifier or transmit the complementary input data and the data inversion flag to the single-ended bitline sense amplifier based on whether the DSI control unit transmitted the data inversion flag to the global input/output multiplexer, wherein the DSI control unit is disposed in front of the global input/output driver and is configured to transmit the data inversion flag to the global input/output multiplexer.

14. The memory device of claim 9, wherein the DSI circuit is configured to transmit the input data as-is to the single-ended bitline sense amplifier when the first number of bits having the first level being less than or equal to the second number of bits having the second level, and the single-ended bitline sense amplifier is configured to store the input data as-is in the normal memory cells.

* * * * *